United States Patent [19]
Gilley et al.

[11] Patent Number: 5,737,923
[45] Date of Patent: Apr. 14, 1998

[54] THERMOELECTRIC DEVICE WITH EVAPORATING/CONDENSING HEAT EXCHANGER

[75] Inventors: Michael D. Gilley, Rowlett, Tex.; Ralph L. Webb, Port Matilda, Pa.

[73] Assignee: Marlow Industries, Inc., Dallas, Tex.

[21] Appl. No.: 544,169

[22] Filed: Oct. 17, 1995

[51] Int. Cl.$^6$ ................................................. F25B 21/02
[52] U.S. Cl. ................... 62/3.7; 62/3.3; 165/104.26; 165/104.33; 165/DIG. 517; 165/911
[58] Field of Search .......................... 62/3.2, 3.3, 3.6, 62/3.7; 165/104.33, 104.26, 133, 911, 517

[56] References Cited

U.S. PATENT DOCUMENTS

| | | | |
|---|---|---|---|
| 2,083,611 | 6/1937 | Marshall | 165/104.21 |
| 2,947,150 | 8/1960 | Roeder, Jr. | 62/3.6 |
| 3,205,667 | 9/1965 | Frantti | 62/3 |
| 3,821,881 | 7/1974 | Harkias | 62/3.6 |
| 3,823,567 | 7/1974 | Corini | 62/3 |
| 3,990,862 | 11/1976 | Dahl et al. | 29/191.2 |
| 4,007,600 | 2/1977 | Simms | 62/3 |
| 4,093,755 | 6/1978 | Dahl et al. | 165/104.21 |
| 4,312,012 | 1/1982 | Frieser et al. | 357/82 |
| 4,326,383 | 4/1982 | Reed et al. | 62/3 |
| 4,353,415 | 10/1982 | Klaschka et al. | 165/104.21 |
| 4,472,945 | 9/1984 | Cech et al. | 62/3 |
| 4,586,342 | 5/1986 | Morishita et al. | 62/3.6 |
| 4,726,193 | 2/1988 | Burke et al. | 62/3 |
| 4,744,220 | 5/1988 | Kerner et al. | 62/3 |
| 4,787,442 | 11/1988 | Esformes | 165/181 |
| 4,829,771 | 5/1989 | Koslow et al. | 62/3.64 |
| 4,833,567 | 5/1989 | Saaski et al. | 361/385 |
| 4,833,888 | 5/1989 | Kerner et al. | 62/3.3 |
| 4,855,810 | 8/1989 | Gelb et al. | 357/87 |
| 4,966,226 | 10/1990 | Hamburgen | 165/104.26 |
| 4,989,626 | 2/1991 | Takagi et al. | 137/13 |
| 4,995,451 | 2/1991 | Hamburgen | 165/104.33 |
| 5,064,476 | 11/1991 | Recine, Sr. | 136/201 |
| 5,154,661 | 10/1992 | Higgins | 62/3.3 |
| 5,206,791 | 4/1993 | Novotny | 361/385 |
| 5,209,069 | 5/1993 | Newman | 62/3.64 |
| 5,253,702 | 10/1993 | Davidson et al. | 165/80.4 |
| 5,308,920 | 5/1994 | Itoh | 174/15.2 |
| 5,343,940 | 9/1994 | Jean | 165/104.33 |
| 5,367,890 | 11/1994 | Doke | 62/3.7 |

FOREIGN PATENT DOCUMENTS 320580A of 1991 Japan.

OTHER PUBLICATIONS

U.S. Patent Application Serial No. 08/416,450 filed Apr. 3, 1995, entitled "Integrated Thermoelectric Device and Heat Exchanger".

U.S. Patent Application Serial No. 08/201,619 filed Feb. 25, 1994 (now abandoned), entitled "Integrated Thermoelectric Device and Heat Exchanger".

R. Webb, *Principles of Enhanced Heat Transfer*, Chapter 11 (1992).

*Primary Examiner*—John M. Sollecito
*Attorney, Agent, or Firm*—Baker & Botts, L.L.P.

[57] ABSTRACT

A thermoelectric heat transfer system having a thermoelectric device and a heat exchanger with an evaporating surface and a condensing surface. A working fluid is sealed within the heat exchanger. The thermoelectric device includes a thermally conductive hot plate and a thermally conductive cold plate with thermoelectric elements disposed therebetween and the thermoelectric elements are electrically coupled in series and thermally coupled in parallel. The evaporating surface of the heat exchanger is thermally coupled with the hot plate. A fluid flow path to allow working fluid in its vapor phase to flow from the evaporating surface to the condensing surface and working fluid in its liquid phase to flow from the condensing surface to the evaporating surface.

32 Claims, 4 Drawing Sheets

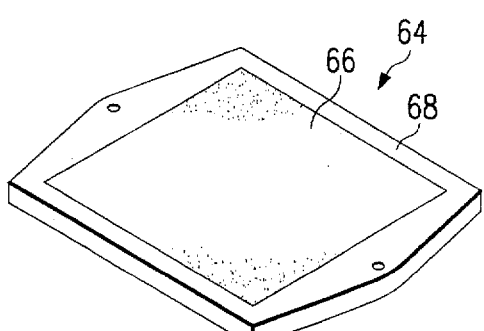
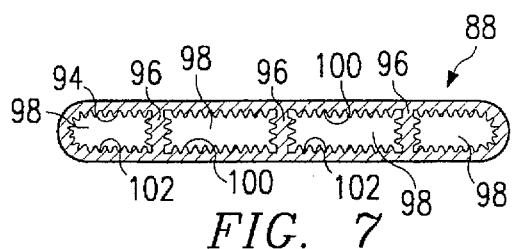
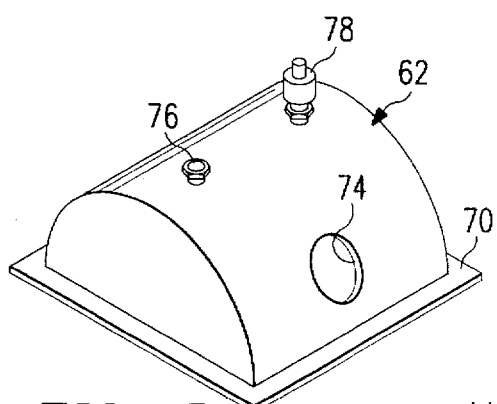
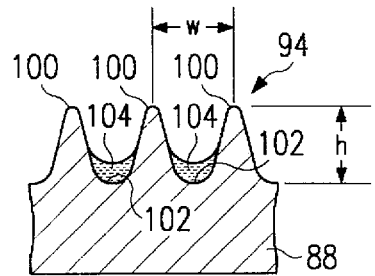
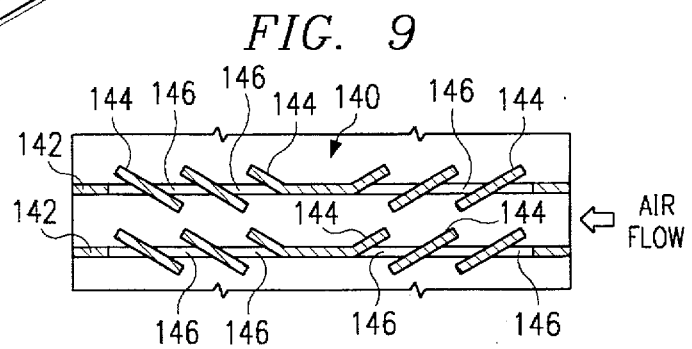
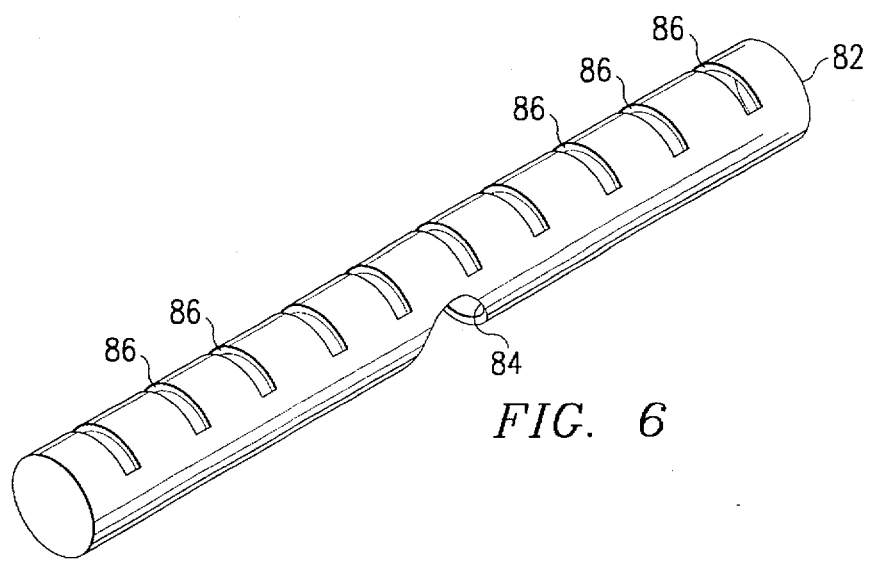

THERMOELECTRIC DEVICE WITH EVAPORATING/CONDENSING HEAT EXCHANGER

RELATED APPLICATION

This application is related to copending application entitled Integrated Thermoelectric Device and Heat Exchanger, Ser. No. 08/416,450 filed Apr. 3, 1995 which is a continuation of Integrated Thermoelectric Device and Heat Exchanger, Ser. No. 08/201,619 filed Feb. 25, 1994 (now abandoned).

TECHNICAL FIELD OF THE INVENTION

This invention relates in general to thermoelectric devices, and more particularly to a thermoelectric device with a heat exchanger having an evaporating section and a condensing section.

BACKGROUND OF THE INVENTION

The basic theory and operation of thermoelectric devices has been developed for many years. Thermoelectric devices are essentially small heat pumps which follow the laws of thermodynamics in the same manner as mechanical heat pumps, refrigerators, or any other apparatus used to transfer energy. Thermoelectric devices can function as a cooler, heater, power generator or thermal energy sensor.

Modern thermoelectric devices typically have solid state electrical components as compared to more traditional mechanical/fluid heating and cooling components. The circuit for a modern thermoelectric device generally includes two dissimilar materials such as N-type and P-type thermoelectric semiconductor elements typically arranged in an alternating N-element and P-element configuration. The thermoelectric elements are generally coupled electrically in series and thermally in parallel. The Peltier effect occurs when voltage is applied to the N-type and the P-type elements resulting in current flow through the serial electrical coupling. The serial current flow results in heat transfer across the N-type and P-type elements in the parallel thermal coupling. The direction of current flow through the thermoelectric elements determines the direction of heat transfer by the thermoelectric elements.

The efficiency of a thermoelectric device typically decreases with an increase in the difference in temperature across the associated thermoelectric elements. To achieve a minimal temperature difference across the thermoelectric elements, a first heat-sink (sometimes referred to as the "hot sink") is preferably coupled to the hot side of the thermoelectric device to aid in dissipating heat from the thermoelectric elements to the adjacent environment. In a similar manner, a second heat sink (sometimes referred to as a "cold sink") is often coupled to the cold side of the thermoelectric device to aid in removing heat from the adjacent environment. Increased cooling of the first heat sink or hot sink further increases the efficiency of the associated thermoelectric device. Natural convection, forced convection, liquid cooling or a combination thereof are currently practiced methods for cooling the hot sink.

For some applications natural convection cooling of a heat sink may not be sufficient to dissipate sufficient heat energy to allow the associated thermoelectric device to operate properly. Forced convection cooling enhances, natural convection cooling by forcing air flow across the heat transfer surfaces of the heat sink thereby increasing the heat dissipating capability of the heat sink. Unfortunately, forced convection cooling systems require additional hardware and circuitry to control the fans, motors and power convertors along with fittings necessary for forced convection cooling. These additional components add to the complexity of the associated thermoelectric heat transfer system.

Liquid cooling of a heat sink to increase energy dissipation from the heat sink is also currently practiced and involves providing liquid coolant flow through or around the associated heat sink. Unfortunately, such liquid cooling also requires additional hardware and fittings to provide the desired liquid coolant flow.

Boiling a liquid on a surface of a heat sink is another technique to increase energy dissipation from the heat sink. From the perspective of enhanced thermodynamic efficiency associated with boiling a liquid such as a refrigerant, it is often desirable to have vaporization of the liquid take place with very little, if any, superheating of the bulk liquid. Open cell porous coatings have previously been used on some heat exchanger elements to provide an enhanced heat transfer surface which will thermodynamically effect boiling of the liquid. The porous coating on the enhanced heat transfer surface provides a multitude of interconnected open cells which are partially filled with liquid and act as nucleation sites for the growth of vapor bubbles within the boiling liquid. U.S. Pat. No. 3,990,862 entitled "Liquid Heat Exchanger Interface and Method" provides examples of such enhanced heat transfer surfaces. U.S. Pat. No. 3,990,862 is incorporated by reference for all purposes with this patent application.

Various enhanced heat transfer surfaces have previously been used to improve the thermodynamic efficiency with respect to condensing vapors on the associated surfaces. Enhanced heat transfer surfaces have also been used to improve the thermodynamic efficiency of both natural and forced convection cooling of the associated surfaces.

SUMMARY OF THE INVENTION

In accordance with the present invention, a thermoelectric heat transfer system having a thermoelectric device and at least one heat exchanger are provided to substantially eliminate or reduce disadvantages and problems associated with previous thermoelectric heat transfer systems. The present invention provides increased heat transfer capability for a thermoelectric device by using at least one heat exchanger having an evaporating or boiling surface and a condensing surface with a working fluid sealed within the heat exchanger. For some applications, one or more enhanced heat transfer surfaces are incorporated as part of the heat exchanger. As a result, boiling and condensing of the working fluid can occur with a relatively low heat flux and improved thermodynamic efficiency.

A thermoelectric device of the present invention preferably includes first and second thermally conductive plates having multiple thermoelectric elements disposed therebetween. At least one of the thermally conductive plates is thermally coupled with a heat exchanger incorporating teachings of the present invention. The heat exchanger preferably includes a first chamber or boiling section and a second chamber or condensing section with one or more enhanced heat transfer surfaces formed as part of the respective boiling section and condensing section. A fluid communication flow path is provided between the condensing section and the boiling section to allow working fluid to flow between these two sections of the heat exchanger. The geometric configuration and dimensions associated with the first chamber and the second chamber can be varied in accordance with the teachings of the present invention to optimize the performance of the associated thermoelectric device.

Technical advantages of a thermoelectric heat transfer system incorporating teachings of the present invention include reducing the operating temperature and/or the difference in temperature across thermoelectric elements and associated components to substantially increase both the heat transfer capability and resulting service life of the heat transfer system. A heat exchanger incorporating the teachings of the present invention results in increased heating and cooling efficiency for the associated thermoelectric device by providing an enhanced heat transfer surface to promote nucleate boiling of a selected working fluid with relatively low heat flux. Without the use of an enhanced heat transfer surface, a relatively high heat flux is required to achieve nucleate boiling on a conventional heat transfer surface. The use of enhanced heat transfer surfaces in accordance with the teachings of the present invention results in nucleate boiling with very low amounts of heat flux and little or no superheating of the associated working fluid.

Further technical advantages of the present invention include selecting a working fluid having a phase change from liquid to vapor within the selected temperature operating range of the associated thermoelectric device. The latent heat of vaporization associated with the phase change results in a substantial increase in energy transfer without requiring a significant increase in the operating temperature of the associated thermoelectric heat transfer system.

A thermoelectric heat transfer system incorporating teachings of the present invention may be used to provide cooling for electronic components such as the central processing unit (CPU) in a microprocessor, cooling for a field effect transistor, a thermoelectric refrigerator, organ transport container or portable personal coolers. The present invention allows optimizing the area of a boiling surface formed in the heat exchanger with respect to the thermoelectric device to substantially reduce the difference in temperature across various heat transfer surfaces including the thermoelectric elements. The present invention also allows optimizing the distance between a hot side heat exchanger and a cold side heat exchanger disposed on opposite sides of a thermoelectric device to minimize natural convection and conduction flow of thermal energy between the respective heat exchangers.

Further technical advantages of the present invention include the use of working fluids which are environmentally friendly while at the same time substantially increasing the thermal efficiency of the associated thermoelectric device. Enhanced heat transfer surfaces may be provided as part of the boiling section, condensing section and/or convection cooler associated with the heat exchanger. The enhanced heat transfer surfaces may be fabricated by cold forming aluminum, copper or alloys of these metals as appropriate for the selected working fluid and designed heat transfer rate.

BRIEF DESCRIPTION OF THE DRAWINGS

For a more complete understanding of the present invention and the advantages thereof, reference is now made to the following written description taken in conjunction with the accompanying drawings, in which:

FIG. 4 is an isometric drawing showing a portion of a boiling section having an enhanced heat transfer surface satisfactory for use with the heat exchanger of FIG. 2;

FIG. 5 is an isometric drawing showing another portion of the boiling section satisfactory for use with the heat exchanger of FIG. 2;

FIG. 6 is an isometric drawing showing a portion of a condensing section satisfactory for use with the heat exchanger of FIG. 2;

FIG. 7 is a drawing in section taken along lines 7—7 of FIG. 3 showing enhanced heat transfer surfaces contained within one of the condensing tubes;

FIG. 8 is an enlarged drawing in section with portions broken away showing the enhanced heat transfer surfaces of FIG. 7;

FIG. 9 is an enlarged drawing in section taken along lines 9—9 of FIG. 3 with portions broken away showing enhanced heat transfer surfaces formed as part of the convection cooler of FIG. 3;

DETAILED DESCRIPTION OF THE INVENTION

The preferred embodiments of the present invention and its advantages are best understood by referring to FIGS. 1–13 of the drawings, like numerals being used for like and corresponding parts of the various drawings.

Figure 1:
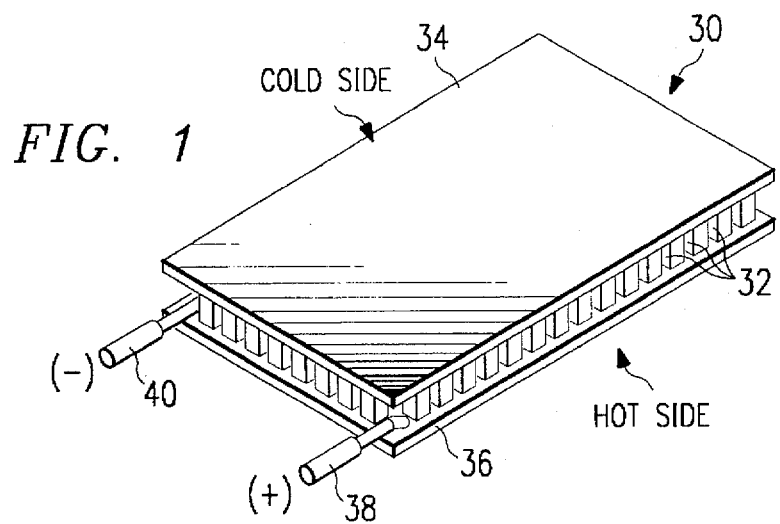
FIG. 1 is a schematic drawing showing an isometric view of a thermoelectric device satisfactory for use with the present invention.

FIG. 1 shows thermoelectric device 30 including a plurality of thermoelectric elements 32 disposed between thermally conductive plates 34 and 36. Thermally conductive plates 34 and 36 may be formed from ceramic and/or composite materials as desired. Thermoelectric elements 32 may be formed from selected materials such as bismuth telluride to provide an array of P-N junctions with desired thermoelectric characteristics to allow thermoelectric device 30 to function as a heat pump. Appropriate bonding techniques such as soldering (not explicitly shown) may be used to electrically and thermally couple plates 34 and 36 to thermoelectric elements 32 disposed therebetween.

Thermoelectric devices (sometimes referred to as thermoelectric coolers) satisfactory for use with the present invention, are available from Marlow Industries, Inc., located in Dallas, Tex. U.S. Pat. No. 4,855,810, entitled Thermoelectric Heat Pump, and U.S. Pat. No. 5,064,476, entitled Thermoelectric Cooler and Fabrication Method, show various details associated with fabrication of thermoelectric devices satisfactory for use with the present invention. These patents are incorporated by reference for all purposes within this application.

Thermoelectric elements 32 are preferably coupled electrically in series and thermally in parallel by conductive plates 34 and 36. Thermoelectric device 30 also includes couplings to a DC power supply (not explicitly shown) by way of positive DC connection 38 and negative DC connection 40. The power supply can be a battery, DC power generator, AC/DC convertor, or any other appropriate source of DC electricity. When DC electricity with the appropriate polarity is supplied to thermoelectric device 30, heat is absorbed on the cold side represented by second conductive plate 34. The heat passes through thermoelectric elements 32 and is dissipated on the hot side represented by first conductive plate 36. Electrical connections 38 and 40 are typically attached to first conductive plate or hot plate 36 to eliminate the need to transfer any thermal energy or heat associated with electrical connections 38 and 40 from cold plate 34 through thermal electric elements 32 to hot plate 36.

Figure 2:
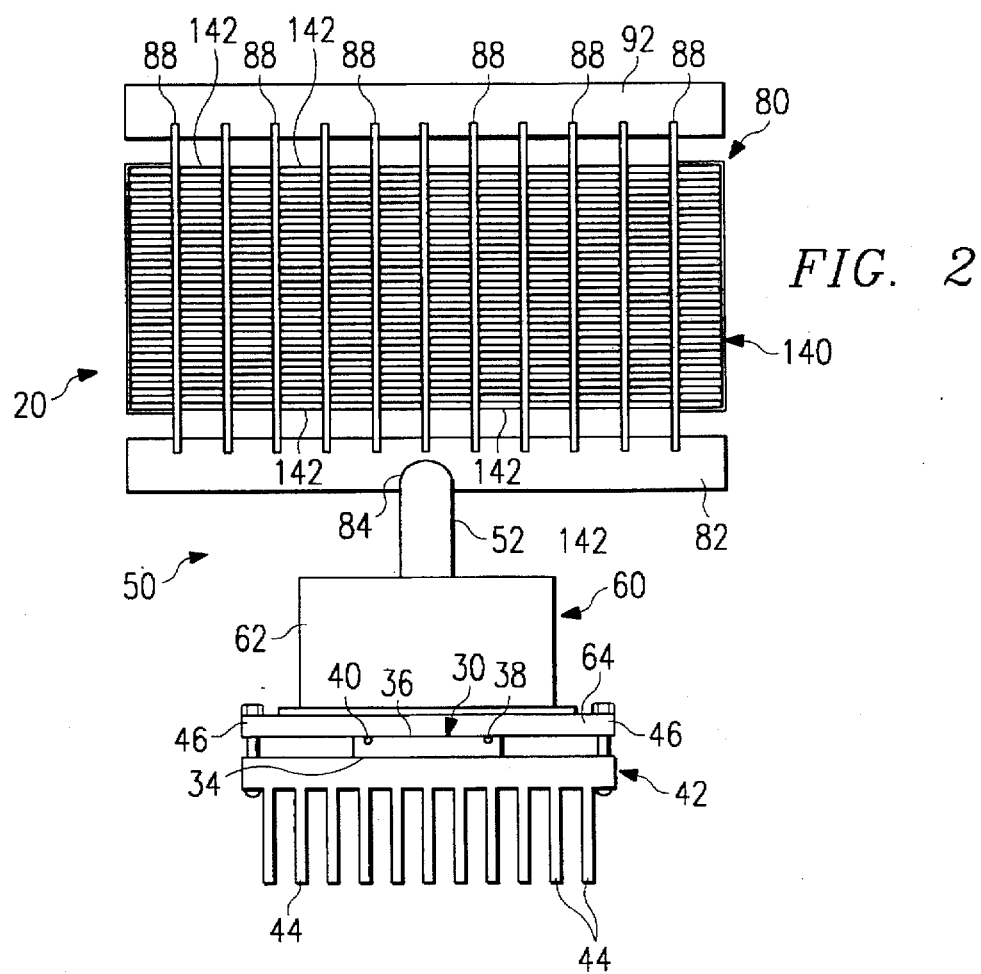
FIG. 2 is a schematic drawing in elevation of a thermoelectric heat transfer system with a thermoelectric device and heat exchanger incorporating one embodiment of the present invention.

Thermoelectric heat transfer system 20 as shown in FIG. 2 includes thermoelectric device 30 and heat exchanger 50 incorporating various teachings of the present invention. The efficiency of thermoelectric device 30 is enhanced by mounting heat exchanger 50 on first conductive plate or hot plate 36. Various methods may be used to mount heat exchanger 50 on first conductive plate 36, including adhesive bonding, compression using thermal grease, and/or soldering.

Figure 3:
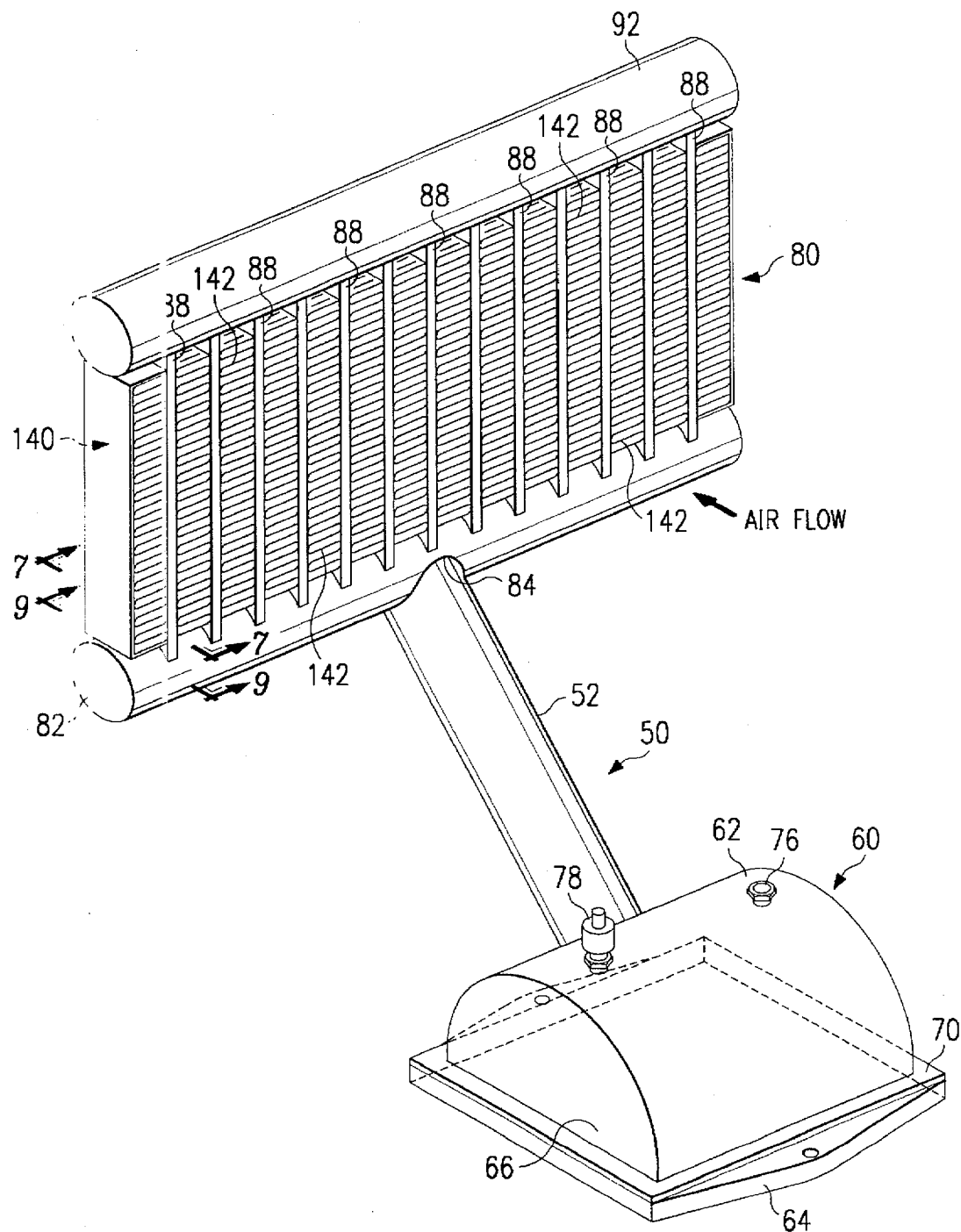
FIG. 3 is an enlarged isometric drawing showing the heat exchanger of FIG. 2.

For the embodiment shown in FIGS. 2 and 3, heat exchanger 50 includes first chamber or boiling section 60 and second chamber or condensing section 80. Depending upon the application for thermoelectric heat transfer system 20 and the desired operating temperature range for thermoelectric device 30, various types of working fluid, which are preferably environmentally friendly, may be placed within heat exchanger 50. Working fluids which experience a phase change within the desired operating temperature range for thermoelectric device 30 are particularly beneficial due to the latent heat of vaporization required to make the phase change.

The term "boiling" is used to describe vigorous, turbulent creation of vapor bubbles from a working fluid when the temperature of the working fluid adjacent to a heat transfer surface has been increased to the respective boiling temperature. Heat transfer coefficients associated with boiling fluids are generally much lower than heat transfer coefficients associated with natural or forced air convection and natural or forced liquid convection. As a result, heat transfer rate associated with boiling fluids are much higher.

For some applications, heat exchanger 50 may contain a working fluid which is evaporated or vaporized within first chamber 60 without boiling. For such applications boiling section 60 may be referred to as an evaporating section or a vaporizing section. Heat exchanger 50 may also be described as a "reboiler" or a "thermosiphon reboiler". One of the benefits of the present invention includes the ability to select the type of working fluid and the heat transfer mechanism (boiling, vaporization, and/or evaporation) which optimizes both heat transfer and overall thermal efficiency of the respective thermoelectric device 30. For most working fluids the boiling temperature will vary in response to the pressure within heat exchanger 50.

As will be explained later in more detail, first chamber 60 preferably includes a boiling surface and second chamber 80 preferably includes a condensing surface located remote from the boiling surface. First chamber 60 and second chamber 80 are preferably sealed to prevent undesired escape of working fluid from heat exchanger 50. Condensing section 80 is preferably disposed at an elevated position relative to boiling section 60 such that working fluid which has been heated in boiling section 60 to its vapor phase can flow upwardly into condensing section 80 and working fluid which has been condensed into its liquid phase in the condensing section 80 and flow downwardly into boiling section 60.

A wide variety of alternative fluid flow paths may be formed between the boiling section and the condensing section of a heat exchanger in accordance with the teachings of the present invention. A fluid flow path defined in part by hollow tube 52 is provided between boiling section 60 and condensing section 80. For the embodiment of the present invention represented by heat exchanger 50, working fluid in the liquid state will flow downwardly from condensing section 80 through hollow tube 52 into boiling section 60. Working fluid in the form of vapor and/or gas will flow upwardly from boiling section 60 through hollow tube 52 into condensing tubes 88. For one application, hollow tube 52 has an inside diameter of approximately five eighths of an inch and an outside diameter of approximately 0.8 inches. For the same application the length of hollow tube 52 is approximately four and one half inches.

The geometric configuration and dimensions associated with first chamber 60 and second chamber 80 may be varied substantially in accordance with the teachings of the present invention to optimize the performance of thermoelectric device 30. For some applications, the fluid flow path may be formed from various types of flexible material which allow varying the location of condensing section 80 relative to boiling section 60 depending upon the specific use of thermoelectric heat transfer system 20.

As shown in FIGS. 2 and 3, hollow tube 52 extends upwardly at an angle relative to boiling section 60. As a result, condensing section 80 is located above and offset from boiling section 60. One of the benefits resulting from the present invention includes the ability to vary the orientation of hollow tube 52 with respect to boiling section 60 and condensing section 80 to optimize the performance of the resulting thermoelectric heat transfer system. For some applications such as heat exchanger 250 shown in FIG. 12, a condensing surface may be located directly above a boiling surface in the heat exchanger to take advantage of gravitational forces which allow vaporized working fluid to flow generally upward from the boiling surface to the condensing surface and condensed working fluid in the form of a liquid to flow generally downward from the condensing surface to the boiling surface.

For the embodiment of the present invention shown in FIGS. 2–5, boiling section 60 includes a domed-shaped cover 62 attached to bottom plate 64. The portion of bottom plate 64 disposed within cover 62 is designated as boiling surface 66. For some applications, an enhanced heat transfer surface such as shown in U.S. Pat. No. 3,990,862, entitled "Liquid Heat Exchanger Interface and Method," or other suitable enhanced heat transfer surface, is preferably formed as part of boiling surface 66 of bottom plate 64. For one application, boiling surface 66 preferably has a porous metal coating with a thickness of approximately 0.2 to 2.0 milliliters and a void fraction of approximately 40% to 70%. The porous metal coating may be formed on bottom plate 64 by thermal spray, sintered particles or other suitable techniques to provide boiling surface 66.

Sealing surfaces or flange surfaces 68 are formed around the perimeter of boiling surface 66. Flanges 70 with corresponding sealing surfaces are provided on the perimeter of cover 62 to form a fluid tight barrier with bottom plate 64. The portion of bottom plate 64 opposite from boiling surface 66 is thermally coupled with hot plate 36 of thermoelectric device 30.

For some applications, the dimensions of bottom plate 64 may be selected to correspond with the dimensions of hot plate 36. For other applications, as shown in FIG. 2, bottom plate 64 may be substantially larger than hot plate 36. The present invention allows varying the configuration and area of the boiling surface to reduce the differential temperature between the boiling surface and the associated thermoelectric elements to improve the efficiency of the associated thermoelectric device. Various techniques including soldering, brazing, welding, and/or adhesives may be used to attach cover 62 with bottom plate 64.

As previously noted, various types of working fluid may be placed within heat exchanger 50 to increase the heat transfer capability of thermoelectric device 30. Also, various types of material such as aluminum, copper, silver and alloys of these metals along with various ceramics and/or cermets may be satisfactorily used to form the various components associated with heat exchanger 50. The type of material selected will depend upon the working fluid contained within heat exchanger 50, the amount of thermal energy transferred by thermal electric device 30 and other desired operating characteristics along with manufacturing costs. For example, for many applications, water will be the preferred working fluid since it is generally environmentally friendly. Various copper alloys and aluminum alloys have the desired metallurgical characteristics, including strength and heat transfer coefficients satisfactory for use in fabricating heat exchanger 50. However, some aluminum alloys may experience corrosion problems when water is selected as the working fluid. Therefore, copper and/or copper alloys will often be used to fabricate heat exchanger 50 when water is selected as the working fluid.

One end of hollow tube 52 is attached to opening 74 in cover 62. As shown in FIGS. 2 and 3, condensing section 80 includes distribution header or manifold 82 with a generally circular opening 84 formed therein. Opening 84 is sized to receive the other end of hollow tube 52. As best shown in FIG. 6, a plurality of slots 86 are also formed in header 82 for use in mounting hollow condensing tubes 88 thereto. Condensing section 80 also includes second distribution header or manifold 92 with a plurality of slots (not explicitly shown) formed therein to receive the other end of each condensing tube 88 opposite from first header 82.

Second header 92 is preferably disposed at an elevation above first header 82. For the embodiment shown in FIGS. 2 and 3, hollow condensing tubes 82 are disposed parallel with each other and perpendicular to first header 82 and second header 92. For some applications, second header 92 may be oriented at an angle varying from perpendicular as shown in FIG. 3 to approximately forty-five degrees (45°) (not shown). Since second header 92 is preferably disposed at an elevation above first header 82, gravity will act upon any condensate or liquid formed within condensing tubes 88 and cause the condensate to drain into first header 82.

As shown in FIGS. 2 and 3, heat exchanger 50 also includes convection cooler 140 having a plurality of fins 142 disposed between and thermally engaged with adjacent condensing tubes 88. Convection cooler 140 is used to dissipate thermal energy from the respective condensing tubes 88 to the surrounding environment. For the embodiment shown in FIGS. 2 and 3, heat energy is dissipated by airflow over the respective fins 142. For some applications, a liquid cooling stream (not shown) may be used to remove heat energy from condensing tubes 88 instead of an air cooling stream.

For some applications, condensing section 80 may include two separate enhanced heat transfer surfaces 94 and 144, which are thermally coupled with each other through the walls of respective hollow tubes 88. Working fluid vapors contained within hollow tubes 88 are condensed by enhanced heat transfer surfaces 94. The latent heat of condensation is conducted through the walls of each tube 88 and dissipated to the surrounding atmosphere by enhanced heat transfer surfaces 144 of convection cooler 140.

As shown in FIG. 7, each condensing tube 88 includes partitions 96 which divide the interior of each tube 88 into multiple flow channels 98. Partitions 96 provide required structural strength for respective tubes 88. Partitions 96 and the resulting flow channels 98 extend longitudinally from first header 82 to second header 92. Enhanced heat transfer surfaces 94 are preferably formed on the interior surface of each flow channel 98.

Enhanced heat transfer surfaces 94 include a plurality of tips 100 alternating with flutes 102. Tips 100 and flutes 102 extend longitudinally within flow channels 98 of condensing tubes 88 between first header 82 and second header 92. Tips 100 and flutes 102 cooperate with each other to cause surface tension drainage of condensate from the extreme convex end of each tip 100 into the associated concave channels of the respective flutes 102. Gravity forces acting on condensate 104 contained within flutes 102 cause the condensate to flow in a generally downward direction through the respective flute 102 into first header 82. Evaporated or vaporized working fluid will flow upwardly through the respective flow channels 88 adjacent to and contacting tips 100.

The condensed working fluid will ultimately flow from first header 82 through fluid flow path 52 and return to evaporating section 60 to repeat the boiling cycle and associated heat transfer from thermoelectric device 30 to the ambient environment surrounding convection cooler 140.

The height of each tip 100 measured from its respective flute 102 and the width between adjacent tips 100 is selected to form a layer of condensate 104 within each flute 102. The depth or thickness of the condensate is preferably less than the height for the associated tip 100. If tips 100 are completely covered with a layer of condensate, the condensate will restrict heat transfer through the walls of hollow tubes 88 and the respective tips 100. Thus, condensate 104 would act as a thermal barrier or insulator reducing the thermal efficiency of condensing section 80.

Based on the fluid flow characteristics of the working fluid and particularly the surface tension of the working fluid as condensed on enhanced heat transfer surfaces 94, the length of hollow tubes 88, the height of tips 100 and the width between adjacent tips 100 may be varied to ensure that at least a portion of the exterior surface of each tip 100 is exposed to vapors contained within the respective flow channels 98. Thus, the ability of enhanced heat transfer surfaces 94 to condense working fluid in the vapor or gas phase is substantially increased. If tips 100 are completely covered with a layer of condensate, the heat transfer through the associated tips 100 would be reduced and the capacity to condense vapors contained within the respective flow channel 98 would also be reduced.

The height of tips 100 and the width between adjacent tips 100 is selected in part based on the surface tension of the condensed working fluid contained with heat exchanger 50. For one application tips 100 have a height in the range of approximately 0.025 to 0.070 inches with a spacing in the range of approximately fifteen to forty tips per inch. Tips 100 may have a convex, trapezoid and/or sawtooth profile as desired. Enhanced heat transfer surfaces 94 of condensing tubes 88 cooperate with each other to provide a second condensing surface remotely located from the first condensing surface of boiling section 60.

Enhanced heat transfer surfaces 144 are preferably formed as part of each fin 142 to transmit the latent heat into a flowing ambient airstream. Enhanced heat transfer surfaces 144 provide a turbulent airflow path to break up laminar boundary layer airflow and mix boundary layer airflow with bulk airflow. Such mixing substantially improves the efficiency of the heat transfer process from condensing surface 94 through hollow tubes 88 and convection cooler 140 to the ambient environment. By forming an enhanced heat transfer surfaces 144 on fins 142, convection cooler 140 will maintain the temperature within condensing section 80 at a lower value as compared to a convection cooler without such enhanced heat transfer surfaces.

Convection cooler 140 as shown in FIGS. 2, 3 and 9, preferably includes a plurality of louvered fins 142 with enhanced transfer surfaces 144 formed on each fin 142 and extending into the airflow path through convection cooler 140. A plurality of slits 146 are formed in each fin 142 perpendicular to the direction of airflow through convection cooler 140. For one application, slits 146 is spaced approximately one to one and one half millimeters (1–1.5 mm) from each other. Enhanced heat transfer surfaces 144 are formed by rotating the fin material from the respective slit 146 approximately twenty (20°) to forty-five (45°) degrees relative to the direction of airflow through convection cooler 140. For one application, enhanced heat transfer surfaces 144 are formed at an angle of approximately twenty-seven degrees (27°) relative to the direction of airflow.

Various types of materials including metals, ceramics and/or composite materials may be used to form the components of boiling section 60 and condensing section 80. For some applications, these materials and their method of assembly are selected to withstand an internal pressure of approximately fifty (50) psi. For other applications, the internal working pressure may be five hundred (500) psi or greater.

The internal working pressure contained within heat exchanger 50 will vary depending upon the working fluid contained within heat exchanger 50 and several factors including the amount of heat transferred by thermoelectric elements 32, the thermal efficiency of boiling surface 66, condensing surface 94 and convection cooler 140 and the ambient temperature associated with air flow through convection cooler 140. For most applications the internal working pressure contained within heat exchanger 50 will be greater than atmospheric pressure. A temperature gradient is formed within heat exchanger 50 with boiling surface 66 having the highest temperature and condensing tubes 88 having the lowest temperature. The temperature difference between boiling surface 66 and condensing tubes 88 establishes a pressure difference resulting in vapor flow from boiling section 60 to condensing section 80.

As shown in FIG. 6, fill port 76 may be included as part of cover 62 for use in adding and removing working fluid from heat exchanger 50. Also, pressure relief device 78 may be formed as part of cover 62 to release a portion of the working fluid from heat exchanger 50 if the pressure of the working fluid exceeds a preselected value. The location of fill port 76 and pressure relief device 78 may be varied depending upon the intended application for thermoelectric heat transfer system 20.

Various heat loads may be mounted on or attached to second conductive plate or cold plate 34 of thermoelectric device 30. As shown in FIGS. 2 and 3, thermoelectric heat transfer system 20 includes heat sink 42 attached to and thermally coupled with second conductive plate 34. Heat sink 42 includes a plurality of fins 44 extending therefrom for use in transferring thermal energy from the surrounding environment to second conductive plate 34. The total surface area of heat sink 42 is substantially larger than the surface area of second conductive plate 34. The number and size of fins 44 may be varied to obtain the desired heat transfer capability with respect to second conductive plate 34.

Thermoelectric heat transfer system 20 preferably includes thermoelectric device 30 with heat exchanger 50 mounted on one side and heat sink 42 mounted on the opposite side. Bolts 46 are used to couple first heat exchanger 50 with heat sink 42 with thermoelectric device 30 disposed therebetween. Various types of heat sinks and/or heat exchangers may be thermally coupled with second conductive plate 34.

Figure 10:
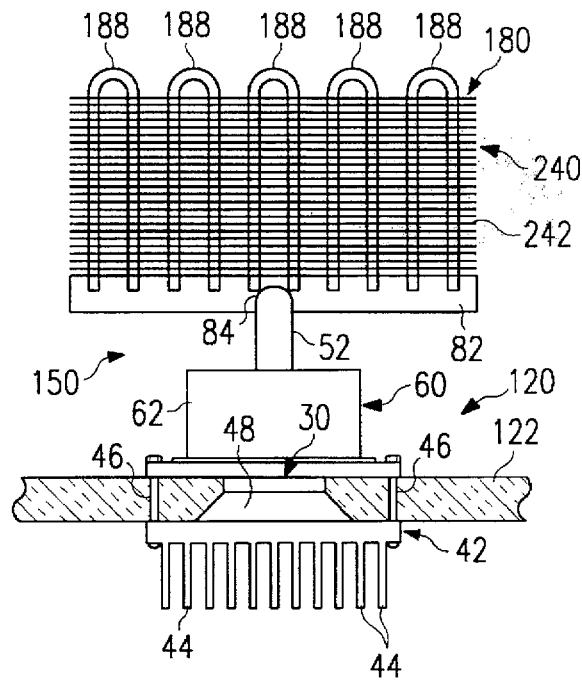
FIG. 10 is a schematic drawing in elevation with portions broken away of a thermoelectric heat transfer system with a thermoelectric device and heat exchanger incorporating an alternative embodiment of the present invention disposed within insulating materials associated with an enclosed structure.

Thermoelectric heat transfer system 120 incorporating an alternative embodiment of the present invention is shown in FIG. 10. Thermoelectric heat transfer system 120 is essentially the same as previously described thermoelectric heat transfer system 20. Layer 122 of insulating material is disposed between first heat exchanger 50 and heat sink 42. Insulating layer 122 may represent a portion of various types of enclosed structures such as a thermoelectric refrigerator, a portable personal cooler, or an organ transport container.

One of the advantages of the present invention includes the ability to install thermoelectric heat transfer system 120 in various types of enclosed structures to maintain a desired temperature within the interior of the enclosed structure. As shown in FIG. 10, heat exchanger 150 is preferably disposed on the exterior of the enclosed structure represented by insulating layer 122 and heat sink 42 will preferably be disposed on the interior of the enclosed structure. For some applications, it may be desirable to place one or more fans (not shown) adjacent to heat sink 42 to increase the flow of air with respect to fins 44. Cold finger 48 may be installed between thermoelectric device 30 and heat sink 42 to provide the desired spacing to accommodate insulating layer 122.

Heat exchanger 150 of thermoelectric heat transfer system 120 is essentially the same as previously described heat exchanger 50 except condensing section 180 has been modified by replacing condensing tubes 88 and second header 92 with generally U-shaped condensing tubes 188. Also, convection cooler 240 formed on the exterior of condensing section 180 has a plurality of fins 242 which do not include an enhanced heat transfer surface as previously described with respect to fins 142.

Figure 11:
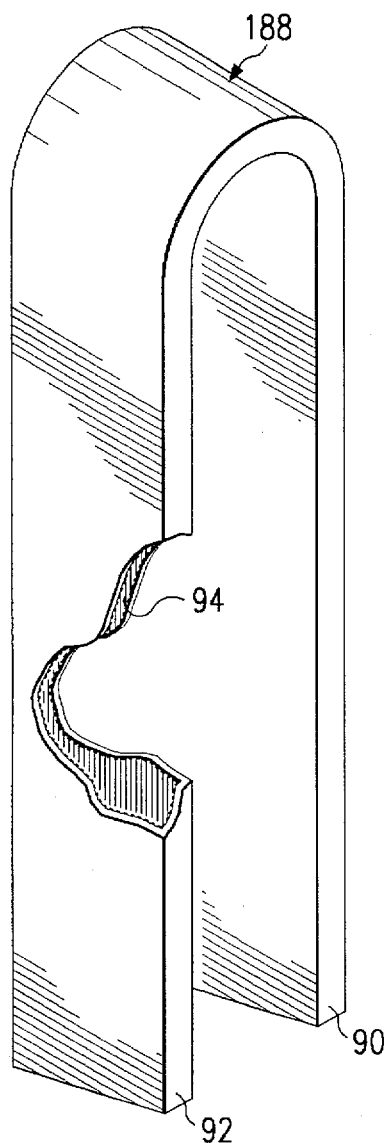
FIG. 11 is an isometric drawing with portions broken away showing a generally hollow, U-shaped condensing tube having enhanced heat transfer surfaces satisfactory for use with the condensing section of the heat exchanger shown in FIG. 10.

As shown in FIG. 11, ends 90 and 92 of each U-shaped condensing tube 188 have a generally rectangular crosssection sized to fit within a respective slot 86 in header 82. Each U-shaped condensing tube 88 preferably included enhanced heat transfer surfaces 94 as previously described for condensing tubes 88. However, partitions 96 are not formed within U-shaped condensing tubes 188 which substantially increases the resulting fluid flow area and minimizes pressure differences within the respective U-shaped condensing tubes 188.

By minimizing the pressure drop within each U-shaped condensing tube 188, problems associated with entrainment of liquid condensate within vaporized working fluid are avoided. Providing a relatively large fluid flow area within U-shaped condensing tubes 188 avoids mixing of working fluid condensate with working fluid vapors and further enhances the thermal efficiency of thermoelectric heat transfer system 120.

Figure 12:
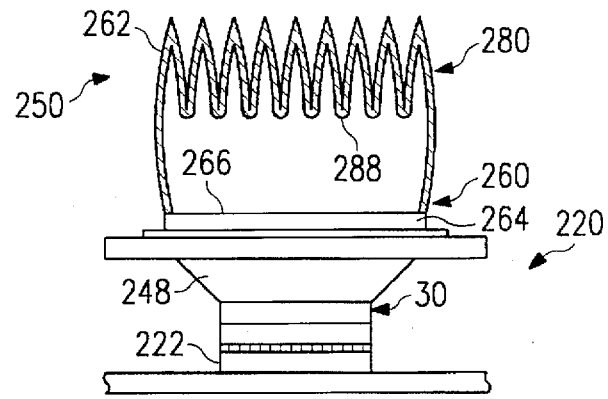
FIG. 12 is a schematic drawing partially in elevation and partially in section with portions broken away showing a thermoelectric heat transfer system incorporating a further embodiment of the present invention to provide cooling for an electronic component.

Thermoelectric heat transfer system 220 incorporating a further embodiment of the present invention is shown in FIG. 12. Thermoelectric heat transfer system 220 is similar to the same as previously described thermoelectric heat transfer systems 20 and 120 except heat sink 42 has been removed and electronic component 222 is thermally coupled with second conductive plate 34. Electronic component 222 may be the central processing unit (CPU) of a microprocessor, a field effect transistor, or any other electronic component or electrical circuit which requires temperature control for satisfactory operation.

Thermoelectric heat transfer system 220 also includes hot finger 248 disposed between thermoelectric device 30 and heat exchanger 250. Hot finger 248 may be formed from various metal alloys and/or ceramic materials having the desired heat transfer characteristics. Heat exchanger 250 includes first boiling surface or enhanced heat transfer surface 266 and a plurality of second condensing surfaces 288. First boiling surface 266 is formed on bottom plate 264. Dome-shaped cover 262 is attached to and extends upwardly from bottom plate 264. Second condensing surfaces 288 are formed as an integral part of dome-shaped cover 262.

As shown in FIG. 12, condensing surfaces 288 are located directly above enhanced heat transfer surface 266 which avoids the need for a separate fluid flow path such as hollow tube 52. If desired, enhanced heat transfer surfaces 94 or other appropriate heat transfer surfaces may be formed as part of second condensing surfaces 288. In a similar manner, a convection cooler with or without enhanced heat transfer surfaces may be disposed on the exterior of condensing section 280 as required in accordance with the teachings of the present invention.

For some applications, enhanced heat transfer surface 266 may be formed from a porous metal coating as previously described with respect to enhanced heat transfer surface 66. For other applications, first boiling surface 266 may have a structured surface to provide the desired enhanced heat transfer characteristics.

Figure 13:
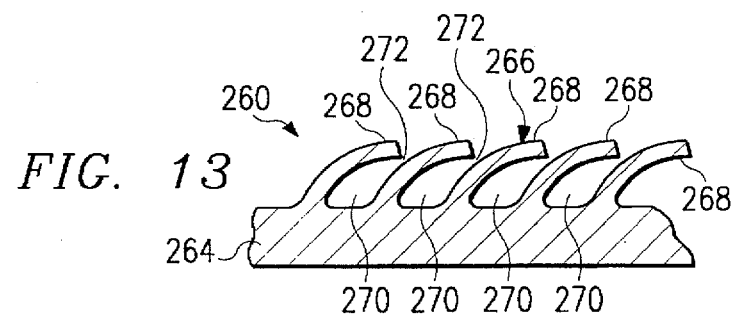
FIG. 13 is a schematic drawing in section with portions broken away showing a structured enhanced heat transfer surface satisfactory for use with the boiling section of a heat exchanger incorporating a further embodiment of the present invention.

Various types of structured surfaces having the desired enhanced heat transfer characteristics are commercially available for use with the present invention. An example of one such structured enhanced heat transfer surface is shown in FIG. 13. Enhanced heat transfer surface 266 includes a plurality of fins 268 which have been mechanically bent over to form liquid cavity 270 with opening 272 between adjacent fins. For one application, enhanced heat transfer surface 266 includes approximately thirty to sixty fins 268 per inch. The height of fins 268 may vary from 0.030 to 0.05 inches. Opening 272 between the tip of one fin 268 and the side of an adjacent fin 268 may vary from 0.001 inches to 0.005 inches.

Various types of heat exchangers incorporating the teachings of the present invention may be thermally coupled with first conductive plate 36. The present invention is not limited to only heat exchangers 50, 150, and 250. Other types of heat exchangers may be used as long as they provide at least one sealed chamber to perform functions similar to boiling section 60 and condensing section 80.

By optimizing the configuration of the respective heat transfer surfaces including providing enhanced heat transfer surfaces as desired, working fluid disposed within heat exchangers 50, 150 and 250 will boil with very little, if any, superheating of the bulk liquid, and the temperature difference across thermoelectric elements 32 and first conductive plate 36 will be substantially minimized. For some applications, depending upon the type of working and the operating temperature of the associated thermoelectric device, heat exchangers 50, 150 and 250 will function satisfactorily without the use of any enhanced heat transfer surfaces.

Examples of working fluids satisfactory for use with thermoelectric transfer systems 20, 120 and 220, include water, alcohol and refrigerants having the desired heat transfer characteristics. Water is often preferred since it is generally environmentally friendly and has no ozone effect. Methanol is an example of one alcohol satisfactory for use with the present invention. Examples of refrigerants satisfactory for use with the present invention include ammonia, ethyl chloride, methyl chloride, sulphur dioxide, fluorocarbons, hydrocarbons, hydrofluorocarbons (HFC) and halogenated hydrocarbons other than chlorofluorocarbons (CFC) which have been generally banned. For some applications, it may be preferable to include a non-CFC refrigerant such as R-134a as the working fluid. The present invention allows the use of many different working fluids including non-CFC refrigerants. Various glycol compounds may also be used as the working fluid.

The various embodiments of the thermoelectric heat transfer system have been generally described in conjunction with cooling a load but can also be used for heating a load without departing from the inventive concepts of the present invention. The thermoelectric heat transfer system of the present invention provides technical advantages of increased efficiency and improved reliability over previously developed thermoelectric heat transfer systems.

Although the present invention and its advantages have been described in detail, it should be understood that various changes, substitutions, and alterations can be made without departing from the spirit and scope of the invention as defined by the appended claims.

What is claimed is:

1. A thermoelectric device and heat exchanger comprising:
    a plurality of thermoelectric elements for transferring thermal energy;
    first and second thermally conductive plates having the thermoelectric element disposed therebetween;
    a working fluid contained within the heat exchanger;
    the heat exchanger having a first, sealed chamber with a first surface for evaporating the working fluid and a second, sealed chamber with a second surface for condensing the working fluid located remote from the first, evaporating surface;
    the second, sealed chamber having a plurality of hollow tubes with an enhanced heat transfer surface formed on the interior of each hollow tube;
    each hollow tube coupled with a manifold to form a portion of the second, sealed chamber;

a plurality of convection cooling fin disposed on the exterior of the hollow tubes whereby the fins transfer heat from the hollow tubes to an environment surrounding the second, sealed chamber;

the first, evaporating surface comprising an enhanced heat transfer surface to promote boiling of the working fluid on the first evaporating surface; and the first surface of the heat exchanger thermally coupled with the first conductive plate of the thermoelectric device.

2. The thermoelectric device and heat exchanger of claim 1 wherein the heat exchanger further composes:

first, sealed chamber and the second, sealed chamber with a fluid flow path disposed between the first chamber and the second chamber;

the first, evaporating surface forming a part of the first chamber and the second, condensing surface formed as a part of the second chamber;

the first conductive plate of the thermoelectric device attached to the first, evaporating surface on the exterior of the first chamber; and the fluid flow path communicating working fluid between the first chamber and the second chamber in response to heat transferred from the thermoelectric device through the first, evaporating surface to the first chamber.

3. The thermoelectric device and heat exchanger of claim 1 wherein the first, evaporating surface further comprises an enhanced heat transfer surface having a porous metal coating with a thickness of 0.2 to 2.0 mm and a void fraction of 40% to 70% with the thermoelectric device coupled to the first, evaporating surface opposite from the enhanced heat transfer surface.

4. The thermoelectric device and heat exchanger of claim 1 wherein the first, evaporating surface further comprises:

an enhanced heat transfer surface having a plurality of fins with each fin having a height in the range of approximately 0.030 to 0.050 inches and spacing of adjacent fins in the range of approximately 30 to 60 fins per inch; and each fin having a tip and the tips of the fins bent to form a plurality of fluid reentry cavities with an opening in the range of 0.001 to 0.005 inches between the tip of one fin and the side of an adjacent fin.

5. The thermoelectric device and heat exchanger of claim 1 wherein the enhanced heat transfer surface of the second, sealed chamber further comprises a plurality of alternating tips and flutes to improve the thermal efficiency of the second surface.

6. The thermoelectric device and heat exchanger of claim 1 further comprising an enhanced heat transfer surface formed as part of the convection cooling fins to improve the thermal efficiency of the adjacent condensing surface.

7. The thermoelectric device and heat exchanger of claim 1 further comprising the heat exchanger formed in part from material selected from the group consisting of aluminum, aluminum alloys, ceramics, cermets, composites, and copper alloys.

8. The thermoelectric device and heat exchanger of claim 1 further comprising the heat exchanger formed in part from copper.

9. The thermoelectric device and heat exchanger of claim 1 further comprising:

a heat sink thermally coupled with the second conductive plate of the thermoelectric device;

the heat sink having a surface area substantially larger than the surface area of the second conductive plate; and the heat sink spaced a selected distance from the first, evaporating surface with the thermoelectric device disposed therebetween.

10. The thermoelectric device and heat exchanger of claim 1 wherein the working fluid comprises water.

11. The thermoelectric device and heat exchanger of claim 1 wherein the working fluid comprises an alcohol.

12. The thermoelectric device and heat exchanger of claim 1 wherein the working fluid comprises methanol.

13. The thermoelectric device and heat exchanger of claim 1 wherein the working fluid comprises a refrigerant selected from the group consisting of ammonia, ethyl chloride, methyl chloride, sulphur dioxide, fluorocarbons, hydrocarbons, halogenated hydrocarbons and hydrofluorocarbon (HFC) compounds.

14. The thermoelectric device and heat exchanger of claim 1 wherein the working fluid comprises a non-CFC refrigerant.

15. The thermoelectric device and heat exchanger of claim 1 further comprising a port for adding and removing the working fluid from the heat exchanger.

16. The thermoelectric device and heat exchanger of claim 1, further comprising at least one pressure relief device to release a portion of the working fluid from the heat exchanger if the pressure of the working fluid exceeds a preselected value in response to heat transferred from the thermoelectric device.

17. A thermoelectric heat transfer system comprising:

a thermoelectric device having a hot plate and a cold plate with a plurality of thermoelectric elements disposed therebetween;

the thermoelectric elements electrically coupled in series with each other and thermally coupled in parallel with respect to the hot plate and the cold plate;

an electrical circuit providing electrical power to the thermoelectric elements to transfer heat energy between the hot plate and the cold plate depending upon the direction of electrical current flow through the thermoelectric elements;

a heat load thermally coupled with the cold plate;

a heat exchanger containing a working fluid;

the heat exchanger having a first, sealed chamber with a first surface for evaporating the working fluid and a second, sealed chamber with a second surface for condensing the working fluid located remote from the first, evaporating surface;

the second, sealed chamber having a plurality of hollow tubes with an enhanced heat transfer surface formed on the interior of each hollow tube:

each hollow tube coupled with a manifold to form a portion of the second, sealed chamber;

a plurality of convection cooling fins disposed on the exterior of the hollow tubes whereby the fins transfer heat from the hollow tubes to an environment surrounding the second, sealed chamber;

the first, evaporating surface comprising an enhanced heat transfer surface to promote boiling of the working fluid on the first, evaporating surface; and the first surface of the heat exchanger thermally coupled with the hot plate of the thermoelectric device to allow heat transfer from the thermoelectric device through the enhanced heat transfer surface of the first, evaporating surface to the working fluid.

18. The thermoelectric heat transfer system of claim 17 wherein the heat load comprises an electronic circuit.

19. The thermoelectric heat transfer system of claim 17 wherein the heat load comprises a microprocessor for a computer.

20. The thermoelectric heat transfer system of claim 17 wherein the heat load comprises a heat sink thermally coupled with the cold plate, the heat sink disposed within an enclosed structure and the thermoelectric device coupled with the heat sink opposite from the enclosed structure.

21. The thermoelectric heat transfer system of claim 20 wherein the enclosed structure is selected from the group consisting of a thermoelectric refrigerator, a portable personal cooler, or an organ transport container.

22. The thermoelectric heat transfer system of claim 17 wherein the heat exchanger further comprises:
the first sealed chamber and the second sealed chamber having a fluid flow path disposed between the first sealed chamber and the second sealed chamber;
the first evaporating surface forming a part of the first sealed chamber and the second, condensing surface forming a part of the second sealed chamber;
the hot plate of the thermoelectric device coupled with the first evaporating surface to transfer heat from the thermoelectric device to the working fluid through the first evaporating surface; and
the fluid flow path communicating working fluid between the first sealed chamber and the second sealed chamber.

23. The thermoelectric heat transfer system of claim 17 wherein the heat exchanger further comprises:
the first sealed chamber and the second sealed chamber having a fluid flow path disposed between the first sealed chamber and the second chamber; and
the fluid flow path providing a communication path to allow evaporated working fluid to flow from the first sealed chamber to the second sealed chamber and condensed working fluid to flow from the second sealed chamber to the first sealed chamber.

24. The thermoelectric heat transfer system of claim 17 further comprising:
the first sealed chamber and the second sealed chamber having a fluid flow path for communicating working fluid between the first sealed chamber and the second sealed chamber; and
the fluid flow path formed from flexible material to allow adjusting the location of the second sealed chamber with respect to the first sealed chamber.

25. The thermoelectric heat transfer system of claim 21 wherein the second condensing surface of the heat exchanger further comprises a plurality of generally hollow U-shaped tubes with an enhanced heat transfer surface formed on the interior of each hollow U-shaped tube.

26. The thermoelectric heat transfer system of claim 17 wherein the second, condensing surface further comprises a plurality of alternating tips and associated flutes to form the enhanced heat transfer surface to improve the thermal efficiency of the condensing surface.

27. The thermoelectric heat transfer system of claim 17 further comprising:
a plurality of fins formed as part of the convection cooler; and
a plurality of slots formed in each fin and a projection extending from each fin at an acute angle relative to the direction of an air flow through the convection cooler whereby the projection and slots cooperate with each other to provide an enhanced heat transfer surface to improve the thermal efficiency of the adjacent condensing surface.

28. A method for increasing the heat transfer efficiency of a thermoelectric device having a plurality of thermoelectric elements disposed between a first thermally conductive plate and a second thermally conductive plate with the thermoelectric elements electrically coupled in series with respect to each other and thermally coupled in parallel with respect to the thermally conductive plates, comprising the steps of:
forming a heat exchanger having a first, sealed chamber and a second, sealed chamber;
forming a fluid flow path between the first chamber and the second chamber;
forming a first evaporating surface having an enhanced heat transfer surface as a part of the first chamber;
forming the second chamber from a plurality of hollow tubes with an enhanced heat transfer surface disposed on the interior of each hollow tube;
coupling each hollow tube with a manifold to form a portion of the second, sealed chamber;
attaching a plurality of convection cooling fins to the exterior of the hollow tubes whereby the fins transfer heat from the hollow tubes to the environment surrounding the second, sealed chamber;
placing a working fluid within the heat exchanger and sealing the heat exchanger to prevent undesired escape of the working fluid;
thermally coupling the first evaporating surface with the first thermally conductive plate to allow heat transfer from the thermoelectric device to the enhanced heat transfer surface of the first, evaporating surface;
providing electrical power to the thermoelectric elements to transfer heat energy from the second thermally conductive plate to the first thermally conductive plate;
transferring heat energy from the first thermally conductive plate to the first evaporating surface to evaporate the working fluid;
communicating the evaporated working fluid from the first chamber to the second chamber through the fluid flow path;
condensing the evaporated working fluid on the second condensing surface in the second chamber; and
returning the condensed working fluid to the first chamber through the fluid flow path.

29. The method of claim 28 further comprising the steps of forming an enhanced heat transfer surface on the first evaporating surface by placing a porous metal coating on the first evaporating surface with a thickness of 0.2 to 2.0 millimeters and a void fraction of 40% to 70% to enhance heat transfer from the thermoelectric device to the enhanced heat transfer surface.

30. The method of claim 28 further comprising the steps of:
fabricating an enhanced heat transfer surface on the first evaporating surface by forming the first evaporating surface from a selected metal alloy;
forming a plurality of fins extending from the first evaporating surface with each fin having a tip at a height in the range of approximately 0.030 to 0.050 inches and spacing the fins in the range of approximately 30 to 60 fins per inch on the first evaporating surface; and bending the tips of the fins to form a plurality of fluid cavities with openings in the range of approximately 0.001 to 0.005 inches between the tip of one fin and the side of an adjacent fin.

31. The method of claim 28 further comprising the steps of forming a plurality of alternating tips and flutes as part of the second, condensing surface to provide the enhanced heat transfer surface to improve the thermal efficiency of the condensing surface.

32. The method of claim 28 further comprising the steps of:

forming a plurality of alternating tips and flutes as part of the second condensing surface; and selecting the height of each tip and the width between adjacent tips to allow surface tension of working fluid condensed on the respective tips to drain the condensed working fluid into the associated flute whereby a portion of each tip remains exposed to evaporated working fluid without forming a boundary layer of liquid on the respective portion of the tip.

* * * * *